United States Patent
Rhie et al.

(10) Patent No.: US 9,287,321 B2
(45) Date of Patent: Mar. 15, 2016

(54) MAGNETIC TUNNEL JUNCTION DEVICE HAVING AMORPHOUS BUFFER LAYERS THAT ARE MAGNETICALLY CONNECTED TOGETHER AND THAT HAVE PERPENDICULAR MAGNETIC ANISOTROPY

(75) Inventors: Kungwon Rhie, Seoul (KR); Jinki Hong, Seoul (KR); Ku-youl Jung, Seoul (KR); Jonghyun Kim, Seoul (KR); Dongsuk Kim, Daegu (KR)

(73) Assignee: Samsung Electronics Co., Ltd. (KR)

( * ) Notice: Subject to any disclaimer, the term of this patent is extended or adjusted under 35 U.S.C. 154(b) by 296 days.

(21) Appl. No.: 13/984,821

(22) PCT Filed: May 26, 2011

(86) PCT No.: PCT/KR2011/003847
§ 371 (c)(1),
(2), (4) Date: Aug. 9, 2013

(87) PCT Pub. No.: WO2011/149274
PCT Pub. Date: Dec. 1, 2011

(65) Prior Publication Data
US 2013/0313665 A1 Nov. 28, 2013

(30) Foreign Application Priority Data
Feb. 10, 2011 (KR) .................. 10-2011-0011807

(51) Int. Cl.
*H01L 27/22* (2006.01)
*B82Y 25/00* (2011.01)
(Continued)

(52) U.S. Cl.
CPC .............. *H01L 27/222* (2013.01); *B82Y 25/00* (2013.01); *G11C 11/16* (2013.01); *H01L 43/08* (2013.01); *H01L 43/10* (2013.01)

(58) Field of Classification Search
CPC .............................. H01L 27/222; B82Y 25/00
USPC ......... 438/3; 257/E43.004, E29.006, E29.167, 257/E29.323, E21.665
See application file for complete search history.

(56) References Cited

U.S. PATENT DOCUMENTS 6,876,523 B2 4/2005 Takahashi et al.
7,329,280 B2 2/2008 Bolling et al.
(Continued)

FOREIGN PATENT DOCUMENTS

JP 62-287641 12/1987
JP 2002-158381 5/2002
(Continued)

*Primary Examiner* — Ha Tran T Nguyen
*Assistant Examiner* — Aaron Dehne
(74) *Attorney, Agent, or Firm* — Myers Bigel & Sibley, P.A.

(57) ABSTRACT

According to a first embodiment of the present invention, a magnetic tunnel junction device comprises: a free layer having a magnetization in a variable direction; a pinned layer having a magnetization in a pinned direction; and a tunnel insulation film formed between the free layer and the pinned layer, wherein the pinned layer includes a ferromagnetic film and an amorphous metal film. In addition, a magnetic device according to a second embodiment of the present invention comprises: an amorphous or nanocrystal material layer; and a perpendicular magnetic anisotropic material layer formed on the amorphous or nanocrystal material layer. The amorphous or nanocrystal material layer is a predefined amorphous material or nanocrystal material layer serving as a lower layer, and the perpendicular magnetic anisotropic material layer is formed on the amorphous or nanocrystal material layer.

6 Claims, 5 Drawing Sheets

(51) Int. Cl.
*G11C 11/16* (2006.01)
*H01L 43/08* (2006.01)
*H01L 43/10* (2006.01)

(56) References Cited

U.S. PATENT DOCUMENTS

| | | | |
|---|---|---|---|
| 2002/0044396 A1* | 4/2002 | Amano et al. | 360/324.2 |
| 2003/0016922 A1 | 1/2003 | DeMartino et al. | |
| 2004/0245553 A1* | 12/2004 | Hosomi et al. | 257/295 |
| 2005/0035383 A1 | 2/2005 | Ha et al. | |
| 2005/0074369 A1 | 4/2005 | Eric | |
| 2006/0056114 A1 | 3/2006 | Fukumoto et al. | |
| 2006/0098354 A1* | 5/2006 | Parkin | 360/324.2 |
| 2006/0180839 A1* | 8/2006 | Fukumoto | B82Y 25/00 257/295 |
| 2007/0053113 A1* | 3/2007 | Papworth Parkin | B82Y 25/00 360/342.2 |
| 2007/0195592 A1* | 8/2007 | Yuasa | 365/171 |
| 2007/0217071 A1 | 9/2007 | Inamura et al. | |
| 2008/0291720 A1* | 11/2008 | Wang et al. | 365/173 |
| 2009/0079018 A1* | 3/2009 | Nagase et al. | 257/421 |
| 2009/0080238 A1* | 3/2009 | Yoshikawa | G11C 11/16 365/158 |
| 2009/0108383 A1 | 4/2009 | Horng et al. | |
| 2010/0109111 A1 | 5/2010 | Shin et al. | |
| 2011/0141803 A1 | 6/2011 | Kim et al. | |

FOREIGN PATENT DOCUMENTS

| | | |
|---|---|---|
| JP | 2003-248909 A | 9/2003 |
| JP | 2004-200245 A | 7/2004 |
| JP | 2005-503669 | 2/2005 |
| JP | 2008-283173 | 11/2008 |
| JP | 2009-081216 | 4/2009 |
| JP | 2009-239131 | 10/2009 |
| KR | 10-2003-0097688 A | 12/2003 |
| KR | 10-2005-001896 A | 2/2005 |
| KR | 10-2007-0094431 A | 9/2007 |
| KR | 10-2009-0115290 A | 11/2009 |
| KR | 10-2010-0047985 A | 5/2010 |
| KR | 10-2011-0068485 A | 6/2011 |
| WO | WO 03/009029 A1 | 1/2003 |

* cited by examiner

MAGNETIC TUNNEL JUNCTION DEVICE HAVING AMORPHOUS BUFFER LAYERS THAT ARE MAGNETICALLY CONNECTED TOGETHER AND THAT HAVE PERPENDICULAR MAGNETIC ANISOTROPY

TECHNICAL FIELD

The present invention relates to a magnetic tunnel junction device, and more particularly, to a magnetic tunnel junction device including a pinned layer having an amorphous metal layer, and a micro magnetic device using a perpendicular magnetic anisotropy material.

BACKGROUND ART

The possibility of industrial applications of spintronics has been focused since the mid-1990s. Herein, the spintronics denotes a compound word of "spin and electronics". That is, electronics research into techniques using "electric charge", one of two characteristics of an electron, has been mainly conducted. However, current electronics research has been conducted to develop devices having new functions by using "spin", i.e., the other characteristics of the electron.

The best way to utilize the spin of an electron is using a ferromagnetic material. In particular, magnetic tunnel junction (MTJ) device using a tunneling magnetoresistance (TMR) structure recently has received more attention due to its wide application areas.

Herein, the TMR structure denotes a structure of ferromagnetic material-insulating layer-ferromagnetic material, wherein the MJT device may be used as a means to store data by using an effect in which a tunneling current attributed to quantum mechanics is affected by a magnetization direction of a ferromagnetic material. Herein, the principle of being able to be used as the data storage means is due to magneto-resistance characteristics, wherein the magneto-resistance characteristics denotes characteristics in which resistance changes according to the arrangement of two ferromagnetic materials.

That is, in the case that magnetization directions of the two ferromagnetic materials are parallel, the tunneling current is the maximum, and in the case in which the magnetization directions of the two ferromagnetic materials are antiparallel, the tunneling current is the minimum. Ferromagnetic materials may have different electron densities depending on a spin direction.

When electrons at the Fermi level of the ferromagnetic material pass through the insulating layer, the electrons may easily move because possible spin directions of two ferromagnetic materials are coincide if the second ferromagnetic material is magnetized in the same direction as the first ferromagnetic material. However, if the ferromagnetic materials are magnetized in opposite directions, scattering of tunneling electrons occurs, and thus, resistance may be increased.

In this case, a material that may provide a high magnetoresistance (MR) ratio may be selected as a tunneling insulating layer, in which MgO has received attention as a new insulating layer.

Also, the uniformity of magnetoresistance as well as the high MR ratio is an important factor in determining the characteristics of a magnetic tunnel junction device. For this purpose, it is important to form a thickness of each layer uniformly, and particularly, it is important to form the thickness of the tunnel insulating layer evenly during a heat treatment process.

However, with respect to a typical magnetic tunnel junction device, many limitations in the uniformity of magnetoresistance have been reported. That is, the flatness of the tunnel insulating layer may be deteriorated due to a lower structure of the tunnel insulating layer during the heat treatment process.

The heat treatment process is an essential process for improving the characteristics of magnetic materials by crystallization of the tunnel insulating layer and the ferromagnetic materials. However, since the lower structure may become rough as the lower structure of the tunnel insulating layer is crystallized, the tunnel insulating layer formed on the lower structure is affected thereby, and thus, the flatness of the tunnel insulating layer deteriorates. As a result, according to a typical structure, since the characteristics of each magnetic tunnel junction device may be different even in the case in which each magnetic tunnel junction device is formed on the same wafer, the uniformity of magnetoresistance may not be secured.

Also, in a typical magnetic tunnel junction device, the tunnel insulating layer may be contaminated by the lower structure during the heat treatment process. In particular, for example, with respect to PtMn or IrMn which is used as a material of an antiferromagnetic (AFM) layer, manganese (Mn) particles may be disposed at an interface of the tunnel insulating layer while the Mn particles diffuse toward the tunnel insulating layer during the heat treatment process, and thus, the Mn particles may contaminate the tunnel insulating layer. In this case, the flatness of the tunnel insulating layer may deteriorate and as a result, it may adversely affect the uniformity of magnetoresistance.

Therefore, a magnetic tunnel junction device having a new structure, which may improve uniformity during the formation of the lower structure of the tunnel insulating layer, is required.

Typically, a single atomic material structure is used as a buffer or a crystalline material is used as a buffer, in order to realize perpendicular anisotropy in a magnetic material. As a result, grains having perpendicular anisotropy are formed to have a diameter of a few micrometers, and thus, in the case that a few tenths of nanometer-sized memory cells are formed in a spin transfer torque (STT)-magnetoresistive random access memory (MRAM) using perpendicular magnetic anisotropy, the possibility of obtaining defective cells may be increased when the cells are formed at grain boundaries.

Also, in a typical technique of controlling perpendicular magnetic anisotropy, the combination of a buffer layer matched with a lattice parameter and a crystal orientation of a material having perpendicular anisotropy is essential in order to control the perpendicular magnetic anisotropy.

However, in this case, a total thickness of the buffer layer increases due to the use of many buffer layers, a specific material having a matched crystal size may only be used, and limitations in processes may occur due to the use of many buffer layers.

Furthermore, deposition of the layer may be impossible on a material ordered in a L10 structure, such as FePt or FePd, which may be used as a pinned layer.

DISCLOSURE OF THE INVENTION

Technical Problem

The present invention provides a magnetic tunnel junction device having improved characteristics by improving the non-uniformity of a tunnel insulating layer that may occur during a heat treatment process.

The present invention also provides a magnetic device including a thin buffer layer which has a simple structure, is independent of the size and structure of crystal, and may provide magnetization connection.

Technical Solution

According to an aspect of the present invention, there is provided a magnetic tunnel junction device including: a free layer magnetizable in a variable direction; a pinned layer having a magnetization in a pinned direction; and a tunnel insulating layer formed between the free layer and the pinned layer, wherein the pinned layer includes a ferromagnetic layer and an amorphous metal layer.

Also, according to another aspect of the present invention, there is provided a magnetic tunnel junction device including: an amorphous or nanocrystal material layer; and a perpendicular magnetic anisotropy material layer formed on the amorphous or nanocrystal material layer. The amorphous or nanocrystal material layer, as a layer of a amorphous or nanocrystal material, is formed on a lower layer, and the perpendicular magnetic anisotropy material layer is formed on the amorphous or nanocrystal material layer.

Thus, since an amorphous material or a nanocrystal material is used as a buffer for forming a perpendicular magnetic anisotropy material on a substrate or a lower layer having a multilayer structure formed on the substrate, the buffer, which has a simple structure and is independent of the size or structure of crystal, may be realized. Herein, the buffer denotes a layer disposed just under the perpendicular anisotropy material (in a case where layers are stacked in an opposite direction, the buffer layer denotes a layer thereabove).

In this case, a crystallization temperature of the amorphous buffer material may be higher than that of the perpendicular magnetic anisotropy material. Thus, in the case that the crystallization temperature of the amorphous buffer material is higher than that of the perpendicular magnetic anisotropy material, the perpendicular magnetic anisotropy material is crystallized to exhibit perpendicular anisotropy, but the adjacent buffer layer functions as an amorphous buffer because the buffer layer is maintained in an amorphous state while crystallization is not undergone.

Also, the amorphous material may be an amorphous metal, and particularly, may be FeZr. Thus, in the case that an amorphous metal is used as the amorphous material, electrical conduction to the perpendicular magnetic anisotropy material layer through the buffer may be facilitated.

The lower layer may be a perpendicular magnetic anisotropy material layer. According to such a configuration, magnetic connection between the perpendicular magnetic anisotropy material layers under and above the amorphous metal layer may be possible while the texture transfer therebetween is blocked.

Also, the lower layer may include an antiferromagnetic material layer. According to such a configuration, a spin valve structure may be possible, in which the upper perpendicular magnetic anisotropy material layer is used as a pinned layer.

Advantageous Effects

In the case that a magnetic tunnel junction device is fabricated according to a first embodiment of the present invention, since the non-uniformity of a tunnel insulating layer that may occur during a heat treatment process may be improved and the diffusion of antiferromagnetic particles that may be formed under a pinned layer may be prevented, the uniformity of magnetoresistance may be improved. As a result, characteristics of the magnetic tunnel junction device may be significantly improved.

Also, according to a second embodiment of the present invention, as a result of inserting a FeZr monolayer as a thin amorphous buffer layer, it may be confirmed that perpendicular magnetic anisotropy occurs in a CoFeB layer adjacent to an MgO layer after a heat treatment.

Since the buffer layer is thin, damage to a sample, which may occur in a prolonged etching process due to the use of a thick buffer layer, may be prevented in the etching process after stacking.

Also, in the case in which a monolayer material having a high crystallization temperature is used as a morphology buffer layer, limitations in a heat treatment temperature generally caused by the crystallization of the buffer layer during a high-temperature heat treatment process for perpendicular magnetic anisotropy may be overcome.

Since the buffer layer is in an amorphous state, even a perpendicular magnetic anisotropy material having a different lattice constant may be used as a buffer layer regardless of a crystal size. Therefore, desired perpendicular magnetic anisotropy may be realized regardless of the texture of a lower electrode.

Also, realization of a CoFeB layer having perpendicular magnetic anisotropy on a pinned layer having strong perpendicular magnetic anisotropy may be possible.

Furthermore, a structure of the present invention may be equally used even in the case in which the sequence of forming a multilayer thin film is reversed.

MODE FOR CARRYING OUT THE INVENTION

Figure 1:
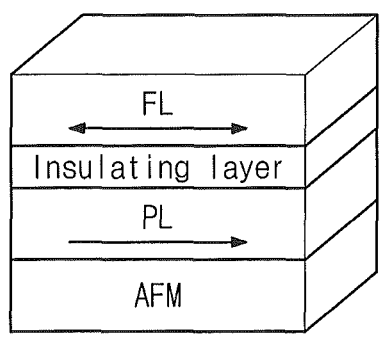
FIG. 1 is a schematic view illustrating a structure of a general magnetic tunnel junction device.

Hereinafter, exemplary embodiments of the present invention will be described. In the drawings, the thickness and spacing are schematically illustrated for convenience in description and may be exaggerated in comparison to an actual thickness. In describing the present invention, a well-known configuration unrelated to the gist of the present invention may be omitted.

In the specification, in adding reference numerals to elements throughout the drawings, it is to be noted that like reference numerals refer to like elements even though elements are shown in different drawings.

FIG. 1 is a schematic view illustrating a structure of a general magnetic tunnel junction device. In general, a magnetization direction of one layer of two ferromagnetic layers is pinned. The layer is denoted as a pinned layer (PL), and the other layer is denoted as a free layer (FL) in which a magnetization direction thereof is changed by an external magnetic field or a penetrating current. Herein, arrows denote the magnetization directions. As illustrated in FIG. 1, the magnetization direction of the PL is pinned, but a magnetization direction of the FL may be changed.

In general, since the PL is used together with an antiferromagnetic (AFM) layer, such as a PtMn or IrMn layer, the magnetization direction of the PL may be difficult to be changed in comparison to the FL. The AFM layer completely separates a range of the magnetic field required for the magnetization reversal of the PL from the FL, and thus, the magnetization reversal of the PL does not occur in a range of an external magnetic field corresponding to a range of actual use and the magnetization reversal of the FL may only be possible.

Eventually, an interlayer structure of the magnetic tunnel junction device is designed to allow the two ferromagnetic layers to be only in two states of having relatively parallel magnetization directions or antiparallel magnetization directions. As a result, an optimum tunneling magnetoresistance (TMR) value may not only be obtained, but may also increase signal stability.

Figure 2:
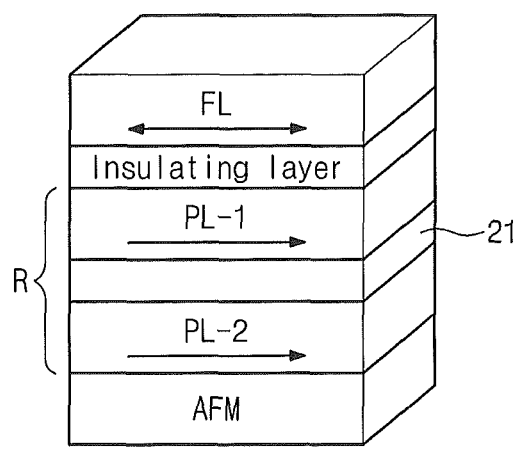
FIG. 2 is a schematic view illustrating a structure of a magnetic tunnel junction device proposed according to a first embodiment of the present invention.

FIG. 2 is a schematic view illustrating a structure of a magnetic tunnel junction device proposed according to a first embodiment of the present invention. For convenience in description, FIG. 2 is illustrated by focusing on a ferromagnetic layer and an AFM layer.

As described above, the magnetic tunnel junction device basically has a structure of "ferromagnetic material-insulating layer-ferromagnetic material", and is formed in such a manner that, for convenience in operation, magnetization of one of two ferromagnetic materials is pinned and the magnetization of the other material may be varied. For convenience, the former is denoted as a pinned layer and the latter is denoted as a free layer. Since a tunneling current may vary according to whether magnetization directions of the two ferromagnetic materials are parallel or antiparallel, the magnetic tunnel junction device may function as a memory device by sensing the tunnel current.

Herein, a material that may secure a high magnetoresistance (MR) ratio may be used as a material constituting the ferromagnetic material, and the material may include CoFe or CoFeB.

The magnetic tunnel junction device of the present invention includes a free layer (FL) magnetizable in a variable direction on a substrate (not shown); a pinned layer (PL) having a magnetization in a pinned direction; and a tunnel insulating layer formed between the FL and the PL, wherein the PL includes ferromagnetic layers PL__1 and PL__2 and an amorphous metal layer 21.

Herein, a crystallization temperature of the amorphous metal layer 21 may be higher than those of the ferromagnetic layers PL__1 and PL__2 and the tunnel insulating layer.

Also, the ferromagnetic layer PL__1, the amorphous metal layer 21, and the ferromagnetic layer PL__2 of the PL may include a stack structure.

The present invention may be different from a typical technique due to the fact that the PL does not have a typical synthetic antiferromagnetic structure, but includes "the ferromagnetic material PL__1—the amorphous metal layer 21 having a high crystallization temperature—the ferromagnetic material PL__2".

Since the amorphous metal layer 21 is further included in the PL formed under the tunnel insulating layer as in the present invention, the ferromagnetic material PL__1 and the ferromagnetic material PL__2 may be grown in uniform thickness by the amorphous metal layer 21 even in the case in which the ferromagnetic material PL__1 and the ferromagnetic material PL__2 are crystallized through a heat treatment process. That is, the roughness of a structure under the tunnel insulating layer may be greatly reduced, and as a result, the tunnel insulating layer may be formed to be flat. Thus, the uniformity of magnetoresistance may be significantly improved.

Meanwhile, as described above, the AFM layer is formed under the PL to pin the magnetization of the PL. In this case, a material of the AFM layer may diffuse into the PL during the heat treatment process, and thus, the tunnel insulating layer may be contaminated.

In the case that the tunnel insulating layer is contaminated, since the tunneling current of the magnetic tunnel junction may vary according to a degree of contamination, the uniformity of magnetoresistance may deteriorate.

However, in the case in which the PL includes the amorphous metal layer 21 having a high crystallization temperature as in the present invention, the above-described phenomenon may be prevented. That is, since the crystallization temperature of the amorphous metal layer 21 is high, an amorphous state is maintained even if the heat treatment process is performed. Also, since the amorphous metal layer 21 is included in the PL, the material of the AFM layer may be difficult to pass through the amorphous metal layer 21.

Furthermore, the amorphous metal layer according to the present invention may include a magnetic material. Therefore, in this case, there is no need to perform a fine thickness adjustment.

Typically, a synthetic antiferromagnetic structure of "ferromagnetic material-ruthenium (Ru)-ferromagnetic material" has been used in order to shield a stray field of a magnetic material. In this case, a thickness of "Ru" as an inserting layer must be finely adjusted.

That is, characteristics of an entire device may vary while magnetic coupling characteristics are changed by the thickness of Ru. Therefore, the changes in the thickness of Ru due to the diffusion of Ru during a heat treatment process may cause changes in switching characteristics of the device.

However, the main object of the present invention is not for shielding the stray field of the magnetic material, but for forming the tunnel insulating layer flat as described above. Therefore, the PL of the present invention includes a ferromagnetic layer and an amorphous metal layer. As described above, a stack structure, in which the amorphous metal layer is formed between the ferromagnetic layers, may be included.

Therefore, in the present invention, there is no need to perform a fine thickness adjustment as described above. However, if necessary, the thickness of the amorphous metal layer may be formed to be as large as or larger than the thickness of the ferromagnetic layers PL__1 and PL__2. In this case, the flatness of the tunnel insulating layer may be improved and simultaneously, the diffusion of the material of the AFM layer formed under the tunnel insulating layer may be blocked.

For example, as described above, CoFe or CoFeB may be used as a material of the ferromagnetic layer of the magnetic tunnel junction device. PtMn or IrMn may be used as a material of the AFM layer pinning the magnetization of the PL.

For convenience in description, an example of using CoFeB as the material of the ferromagnetic layer and IrMn as the material of the AFM layer will be described. MgO may be used as the tunnel insulating layer. However, it is to be noted that other materials may be used as the above-described materials along with the development of related techniques.

In this case, each material is gradually crystallized through the heat treatment process. In the case that the magnetic tunnel junction device is formed in a structure of "CoFeB—MgO—CoFeB—the amorphous metal layer 21 having a high crystallization temperature—CoFeB" as in the present invention, since the amorphous metal layer 21 included is not crystallized before CoFeB is crystallized, the diffusion of manganese (Mn) particles may be prevented.

Then, a material of the amorphous metal layer 21 having a high crystallization temperature may be considered. Herein, since the amorphous metal layer 21 may have a high crystallization temperature and may be a material included in the PL, the amorphous metal layer 21 may have magnetic properties.

In this case, the amorphous metal layer 21 may include FeZr. Although FeZr is suggested in the present specification, it is to be noted that other appropriate materials may also be used as the material of the amorphous metal layer 21 along with the development of related techniques.

That is, since the crystallization temperature of FeZr is high, FeZr is not crystallized but is in an amorphous state, even in the case in which CoFeB is crystallized in a body-centered cubic (bcc) structure or a face-centered cubic (fcc) structure. Also, since FeZr may have three magnetic characteristics, such as ferromagnetic, paramagnetic, and weak ferromagnetic characteristics, according to a ratio between iron (Fe) and zirconium (Zr), FeZr may have a wide range of application in the fabrication of the magnetic tunnel junction device. Furthermore, since there is no need to perform a fine thickness adjustment with respect to FeZr, it may be advantageous in terms of processing.

Figure 3:
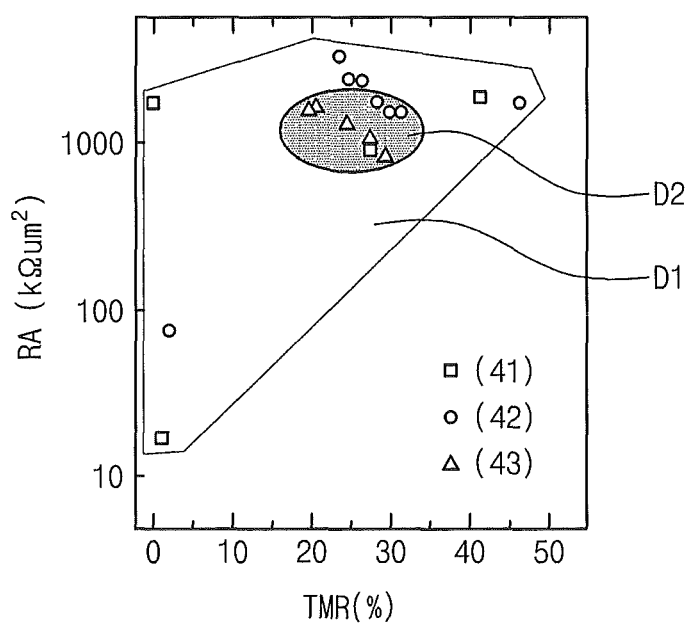
FIG. 3 is a graph illustrating experimental data for describing an effect obtained in the case that FeZr is included in a pinned layer of FIG. 1.

FIG. 3 is a graph illustrating experimental data for describing an effect obtained in the case that FeZr is included in the PL. In the experiments, seven magnetic tunnel junction devices were formed on a SiOx wafer having a size of 12.5 mm×12.5 mm. For the growth of a tunnel insulating layer (MgO), a heat treatment process was performed at 270° C. for 10 minutes under an external magnetic field of 4 kOe. A TMR value of each magnetic tunnel junction device was measured at room temperature by a four-terminal measurement method using a direct current source.

As illustrated in FIG. 3, in a case (41) where FeZr is not included in the PL, distribution (D1) of the TMR values of the seven magnetic tunnel junction devices is relatively wide. However, in a case (42) where 5 Å thick FeZr is included and in a case (43) where 10 Å thick FeZr is included, distribution (D2) of the TMR values is relatively narrow.

Thus, since FeZr is included in the PL, the uniformity of magnetoresistance may be significantly improved and as a result, the reliability in the fabrication and operation of the magnetic tunnel junction device may be secured.

Figure 4:
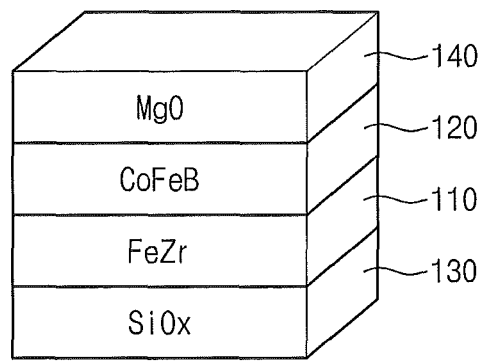
FIG. 4 is a schematic cross-sectional view illustrating an example of a magnetic device according to a second embodiment of the present invention.

FIG. 4 is a schematic cross-sectional view illustrating an example of a magnetic device according to a second embodiment of the present invention. In FIG. 4, in order for a CoFeB magnetic material generally having horizontal magnetic anisotropy to have perpendicular magnetic anisotropy, a stack structure of a sample is illustrated, in which perpendicular magnetic anisotropy is obtained by using a FeZr amorphous morphology buffer layer.

Herein, the expression "morphology buffer layer" denotes a layer preventing the occurrence of texture collision due to the propagation of texture into above and below adjacent thin film layers or a layer blocking the unwanted propagation of texture.

In FIG. 4, the magnetic device includes an amorphous material layer 110 and a perpendicular magnetic anisotropy material layer 120 formed on the amorphous material layer 110. The amorphous material layer 110, as a layer of a predetermined amorphous material, is formed on a bottom layer 130, and the perpendicular magnetic anisotropy material layer 120 is formed on the amorphous material layer 110.

Although an amorphous material is used as the morphology buffer layer 110 in FIG. 4, a predetermined nanocrystal material may be used as a morphology buffer layer instead of the amorphous material. In this case, the nanocrystal material denotes a material that is overall amorphous, but partially crystalline.

In this case, the perpendicular magnetic anisotropy material layer 120 may already have perpendicular anisotropy during the formation of the layer. However, it is generally that perpendicular anisotropy is obtained through a method, such as a heat treatment, after the formation of the layer. Also, an MgO layer 140 or a crystal structure layer similar thereto is required on the top in order for the perpendicular magnetic anisotropy material layer 120 to exhibit perpendicular magnetic anisotropy.

Also, although the bottom layer 130 is realized as a silicon wafer in FIG. 4, the bottom layer 130 may be realized as an electrode in addition to substrates of various materials.

Thus, since the amorphous material or the nanocrystal material is used as a buffer for forming a perpendicular magnetic anisotropy material on the bottom layer 130, the buffer, which is independent of the size or structure of the crystal of the bottom layer 130 and also has a simple structure, may be realized.

In this case, crystallization temperatures of the amorphous material and the nanocrystal material may be higher than that of the perpendicular magnetic anisotropy material. Thus, in the case that the crystallization temperature of the amorphous material is higher than that of the perpendicular magnetic anisotropy material, limitations in a heat treatment temperature due to the crystallization of the buffer layer during a high-temperature heat treatment process for perpendicular magnetic anisotropy may be overcome.

Also, the amorphous material may be an amorphous metal, and particularly, may be FeZr. Thus, in the case that an amorphous metal is used as the amorphous material, electrical conduction to the perpendicular magnetic anisotropy material layer through the buffer may be facilitated.

Figure 5:
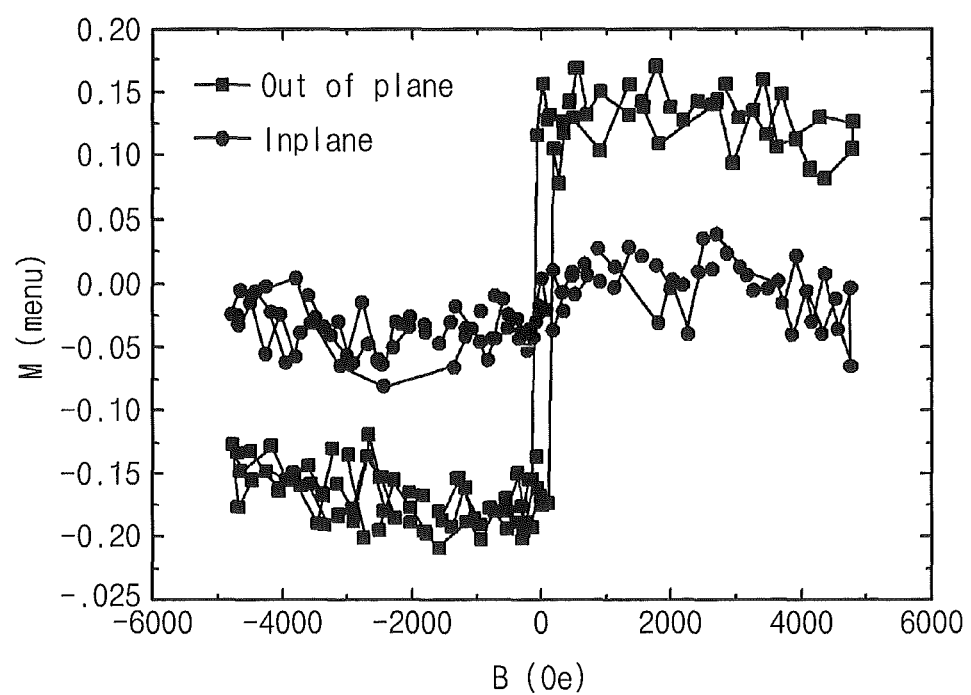
FIG. 5 is a graph illustrating vibrating sample magnetometer (VSM) data showing changes in magnetization in a sample having a structure of FIG. 4 after a heat treatment at 400° C.

FIG. 5 is a graph illustrating vibrating sample magnetometer (VSM) data in a sample having a structure of FIG. 4 after a heat treatment at 400° C. In FIG. 5, since the magnetization reversal occurs in an out-of-plane direction, it may be confirmed that perpendicular magnetic anisotropy may be formed. In addition, various perpendicular magnetic anisotropies may be identified by adjusting the thicknesses of a buffer layer and a CoFeB layer. Also, it may be confirmed that perpendicular magnetic anisotropy is properly formed by using a FeZr amorphous morphology buffer layer.

Figure 6:
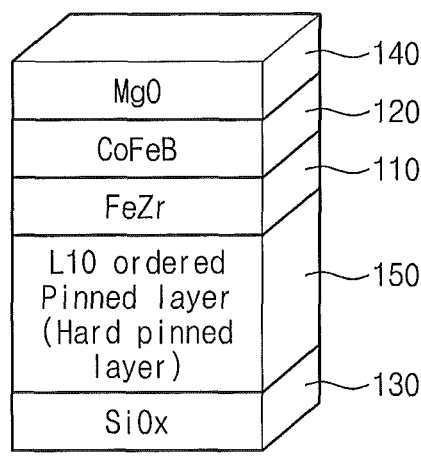
FIG. 6 is a schematic cross-sectional view illustrating another example of the magnetic device according to the second embodiment of the present invention.

FIG. 6 is a schematic cross-sectional view illustrating another embodiment of the magnetic device according to the present invention.@

As illustrated in FIG. 6, a lower anisotropy material layer 150 may be further included between an amorphous metal layer 110 and a substrate 130. According to such a configuration, magnetic connection between the lower magnetic anisotropy material layer 150 under the amorphous metal layer 110 and an upper perpendicular magnetic anisotropy material layer 120 thereabove may be possible while the texture transfer therebetween is blocked.

That is, perpendicular magnetic anisotropy may be realized in the upper portion regardless of the crystallized lower electrode. Since the magnetic connection may be possible while the texture transfer between the lower and upper electrodes is blocked, realization of a structure of perpendicular magnetic CoFeB/MgO on a perpendicular anisotropy hard pinning layer may be possible.

Figure 7:
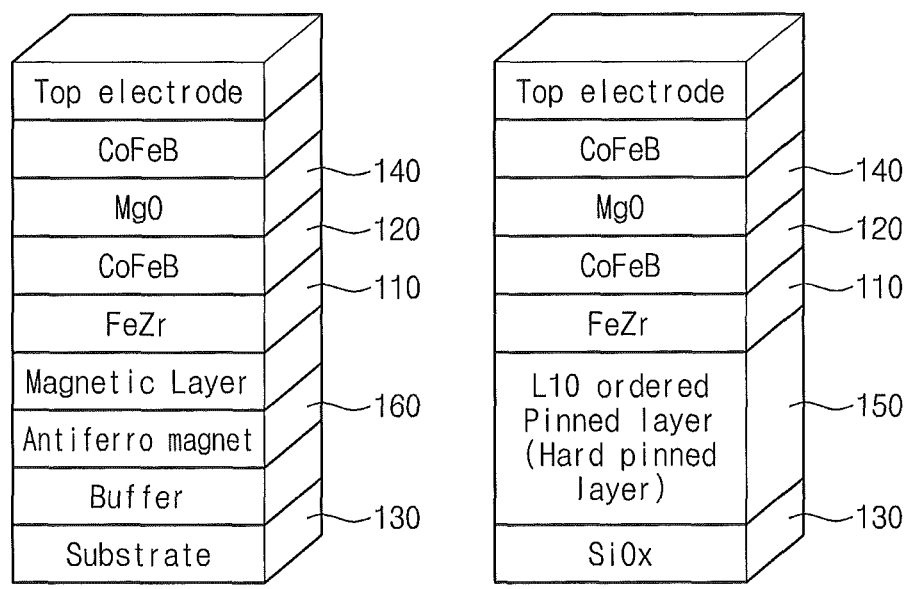
FIG. 7 is a schematic cross-sectional view illustrating an example of the magnetic device including a spin valve structure according to the second embodiment of the present invention.

FIG. 7 is a schematic cross-sectional view illustrating an example of the magnetic device including a spin valve structure according to the present invention. FIG. 7 illustrates a perpendicular-perpendicular spin valve structure of an MgO magnetic tunnel junction (MTJ) having perpendicular magnetic anisotropy by using FeZr that is proposed in the present invention.

With respect to the left-side drawing of FIG. 7, a CoFeB material in an upper portion may be operated as a pinned layer by using an antiferromagnetic material 160 in a lower layer and using a ferromagnetic or paramagnetic FeZr material according to a composition. With respect to the right-side drawing of FIG. 7, the CoFeB material may be operated as a pinned layer by using a L10 ordered hard pinned layer instead of the antiferromagnetic material.

Since a CoFeB material having perpendicular magnetic anisotropy above the pinned layer may also be allowed to be operated as a free layer, realization of a spin valve structure including a perpendicular pinned-perpendicular free layer and having perpendicular magnetic anisotropy may be possible. Thus, operation as a magnetic storage memory may be possible by using the above structure.

Figure 8:
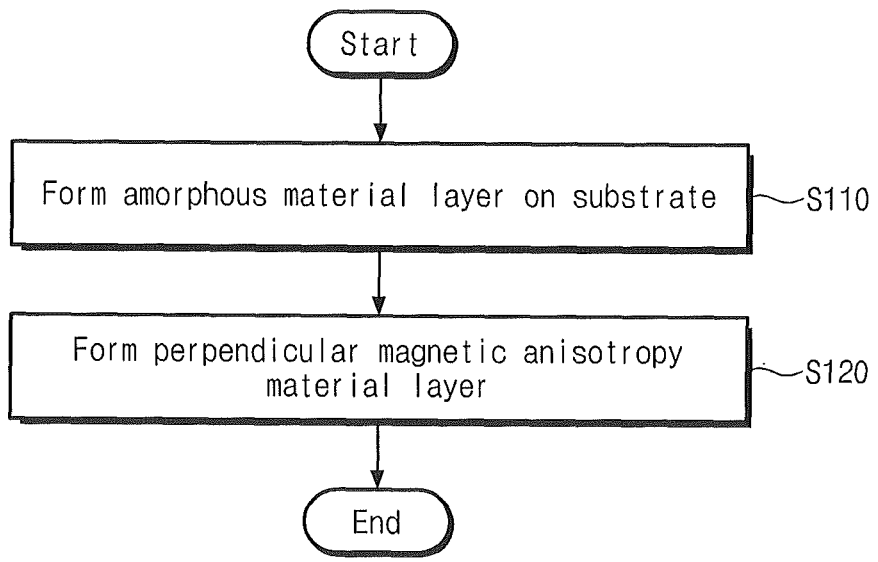
FIG. 8 is a schematic flowchart illustrating an example of a method of fabricating the magnetic device of FIG. 4.

FIG. 8 is a schematic flowchart for performing a method of fabricating the magnetic device of FIG. 4 of the present invention.

In FIG. 8, an amorphous material layer is formed on a substrate (S110), and a material layer to be changed to have perpendicular magnetic anisotropy is formed on the formed amorphous morphology buffer layer (S120).

Specifically, a buffer layer, which is not a combination of various materials or a stack structure but a simple buffer layer, allows a material grown thereabove to have perpendicular anisotropy even at a low thickness, may be used as a buffer layer even in the case that a crystal size is different, and does not cause limitations in a subsequent process, is inserted.

With respect to the buffer layer, it may be confirmed that a thin FeZr layer is used as the amorphous morphology buffer layer and a CoFeB ferromagnetic material grown thereabove has perpendicular anisotropy after a heat treatment process is performed.

The buffer layer may block a bcc structure propagated downward from MgO and other phases propagated from texture (different structure, such as an fcc, face-centered tetragonal (fct), or hexagonal close-packed (hcp) structure) operated upward in the amorphous CoFeB magnetic material according to the heat treatment. Therefore, limitations may be addressed, in which deposition on materials having texture, such as L10, has been impossible.

In addition, since the buffer layer may function as a morphology buffer and simultaneously, magnetization connection may be possible, the realization of a structure of perpendicular anisotropy pinned layer/perpendicular anisotropy free layer may be possible.

Also, with respect to a FeZr material used as the inserting layer, since phase transition into a paramagnetic or ferromagnetic material may be possible by adjusting a compositional ratio between Fe and Zr, a desired phase may be used.

The second embodiment of the present invention may be suitable for the following cases:—in the case that it attempts to propagate a phase in a multilayer through a crystallization process, a nanocrystallization process, or a similar heat treatment process, a case of using a monolayer amorphous material or a multilayer combined thereto in order to block the propagation of a single phase or to block the collision of two or more phases.

In the case the transfer of the phase is caused by using a crystallization process and perpendicular magnetic anisotropy is attempted to be realized therethrough, a case of being used as a morphology buffer layer by allowing a magnetic layer for obtaining perpendicular magnetic anisotropy to be adjacent to an amorphous metal layer having a crystallization temperature higher than a crystallization temperature of the magnetic layer or a multilayer combined therewith, for the purpose of relieving strain due to perpendicular anisotropy.

A case of realizing perpendicular magnetic anisotropy in an upper portion regardless of a crystallized lower electrode.

A case of being applied to perpendicular magnetic anisotropy because magnetic connection may be possible while blocking an effect of crystal type of the electrodes formed in the upper and lower portions.

In summary, with respect to a typical buffer layer for perpendicular magnetic anisotropy, special conditions must be generally satisfied for perpendicular magnetic anisotropy, in which perpendicular magnetic anisotropy may be obtained by using various materials having similar lattice constants as a stack structure.

In this case, a thickness of the buffer layer may increase, and perpendicular magnetic anisotropy may be obtained only in the case in which the buffer layer is formed in a stack structure of various materials or a crystal size satisfies special conditions.

However, according to the present invention, perpendicular magnetic anisotropy may be confirmed in a thin, monolayer-thick buffer layer by using an amorphous morphology buffer layer.

That is, perpendicular magnetic anisotropy may be realized by using an amorphous morphology buffer layer, which may be used as a buffer layer regardless of the crystal size, because the amorphous morphology buffer layer is formed of an amorphous material, and may function as a buffer layer even at a high temperature, because the crystallization temperature thereof is high.

In addition, according to the present invention, the realization of the structure of perpendicular magnetic CoFeB/MgO on the perpendicular magnetic anisotropy hard pinning layer may be possible because magnetic connection may be possible while blocking the transfer of texture of the lower and upper electrodes.

Figure 9:
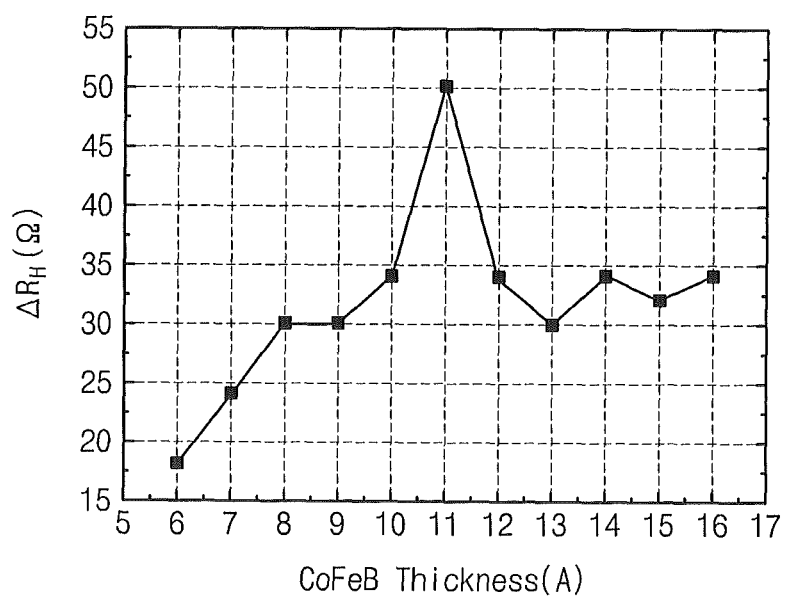
FIG. 9 is a graph illustrating data in which an amount of perpendicular magnetic anisotropy is measured according to a thickness of CoFeB in the structure of FIG. 4.

FIG. 9 is a graph illustrating data in which an amount of perpendicular magnetic anisotropy is measured according to a thickness of CoFeB in the structure of FIG. 4.

As a result of measurement by changing the thickness of CoFeB from 0.5 nm to 1.6 nm, it may be confirmed that targeted perpendicular magnetic anisotropy is obtained when the thickness of CoFeB is in a range of 0.7 nm to 1.6 nm. In particular, it may be confirmed that the largest perpendicular magnetic anisotropy is obtained at a thickness of 1.1 nm.

Figure 10:
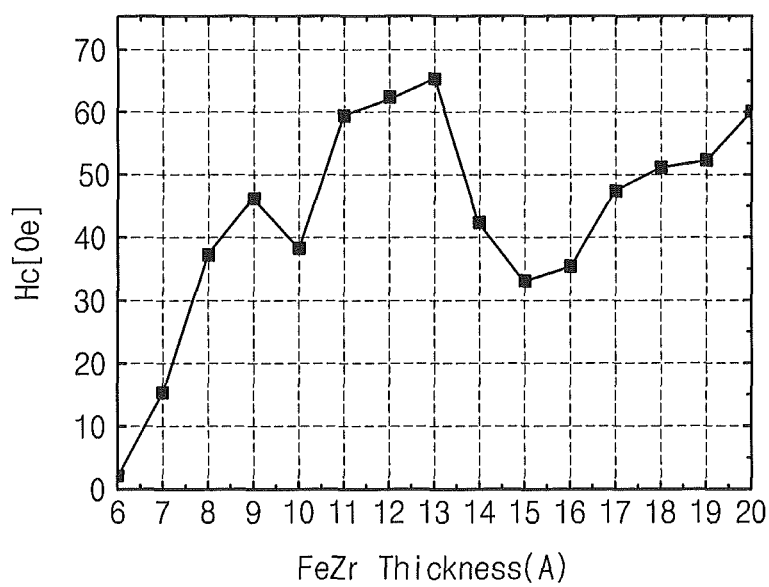
FIG. 10 is a graph illustrating data in which the amount of perpendicular magnetic anisotropy is measured according to a thickness of FeZr in the structure of FIG. 4.

FIG. 10 is a graph illustrating data in which the amount of perpendicular magnetic anisotropy is measured according to a thickness of FeZr in the structure of FIG. 4.

In FIG. 10, as a result of measurement by changing the thickness of FeZr from 0.4 nm to 2.0 nm, it may be confirmed that targeted perpendicular magnetic anisotropy is obtained when the thickness of FeZr is in a range of 0.6 nm to 2.0 nm.

Also, a coercivity value of CoFeB may be changed by controlling the thickness of FeZr, and this means that CoFeB may be used in a desired range of the coercivity value by changing the coercivity thereof.

A FeZr alloy may exhibit various magnetic characteristics, such as paramagnetic and ferromagnetic, according to a composition of FeZr. Therefore, since perpendicular magnetic anisotropy may be controlled to a desired level by controlling the composition of Fe and Zr, and amorphous properties may be maintained even in the case in which magnetic characteristics are changed, various applications of the FeZr alloy as a material having perpendicular magnetic anisotropy may be possible.

Although the present invention has been described in terms of preferred embodiments thereof, the scope of the present invention is not limited thereto. Various modifications or improvements of the embodiments are considered to be within the scope of the present invention as defined by the following claims.

The invention claimed is:

1. A magnetic tunnel junction device comprising:
a free layer magnetizable in a variable direction;
a pinned layer having a magnetization in a pinned direction;
a tunnel insulating layer between the free layer and the pinned layer; and
an antiferromagnetic layer, wherein the pinned layer is between the tunnel insulating layer and the antiferromagnetic layer,
wherein the pinned layer comprises a first ferromagnetic layer, a second ferromagnetic layer and an amorphous metal layer between the first ferromagnetic layer and the second ferromagnetic layer,
wherein a thickness of the amorphous metal layer is greater than a thickness of the first ferromagnetic layer and the second ferromagnetic layer, and
wherein a crystallization temperature of the amorphous metal layer is higher than a crystallization temperature of the first ferromagnetic layer and the second ferromagnetic layer.

2. The magnetic tunnel junction device of claim 1, wherein the crystallization temperature of the amorphous metal layer is higher than a crystallization temperature of the tunnel insulating layer.

3. The magnetic tunnel junction device of claim 1, wherein the amorphous metal layer comprises a magnetic material.

4. The magnetic tunnel junction device of claim 1, wherein the amorphous metal layer comprises FeZr.

5. The magnetic tunnel junction device of claim 4, wherein the amorphous metal layer contacts the first ferromagnetic layer and the second ferromagnetic layer.

6. The magnetic tunnel junction device of claim 5, wherein the first ferromagnetic layer contacts the tunnel insulating layer, and the second ferromagnetic layer contacts the antiferromagnetic layer.

* * * * *